US009934746B2

(12) United States Patent
Takeuchi et al.

(10) Patent No.: US 9,934,746 B2
(45) Date of Patent: Apr. 3, 2018

(54) GATE DRIVING CIRCUIT AND DISPLAY DEVICE COMPRISING THE SAME

(71) Applicant: Samsung Display Co. Ltd., Yongin, Gyeonggi-Do (KR)

(72) Inventors: Noboru Takeuchi, Asan-si (KR); Min Soo Kang, Asan-si (KR); Beom Jun Kim, Seoul (KR); Yoon Ho Kim, Asan-si (KR); Seong Yeol Syn, Asan-si (KR); Hong Woo Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 235 days.

(21) Appl. No.: 15/012,612

(22) Filed: Feb. 1, 2016

(65) Prior Publication Data

US 2016/0358573 A1 Dec. 8, 2016

(30) Foreign Application Priority Data

Jun. 2, 2015 (KR) ........................ 10-2015-0077827

(51) Int. Cl.
    G11C 19/00    (2006.01)
    G09G 3/36     (2006.01)
    G11C 19/28    (2006.01)

(52) U.S. Cl.
    CPC ........... *G09G 3/3677* (2013.01); *G11C 19/28* (2013.01); *G09G 2300/0426* (2013.01); *G09G 2310/0289* (2013.01); *G09G 2310/08* (2013.01)

(58) Field of Classification Search
    None
    See application file for complete search history.

(56) References Cited

U.S. PATENT DOCUMENTS 6,576,926 B1 * 6/2003 Yamazaki ........... G02F 1/13454
                                              257/347
2007/0040793 A1 * 2/2007 Kim ..................... G09G 3/3677
                                              345/100

(Continued)

FOREIGN PATENT DOCUMENTS

JP    2012-256838    12/2012
KR    10-2013-0038856    4/2013

OTHER PUBLICATIONS

Wu et al., "Electrical Analysis and Physical Mechanisms of ∂-InGaZnO Thin Film Transistors with different device structures." Department of Physics National Sun Yat-sen University Master Thesis, Jul. 2012.

(Continued)

*Primary Examiner* — Tuan T Lam
(74) *Attorney, Agent, or Firm* — Innovation Counsel LLP

(57) ABSTRACT

A gate driving circuit is provided. A gate driving circuit comprises a pull-up control unit including a control transistor, a pull-up unit, a carry unit which outputs a clock signal into a kth carry signal and a pull-down unit which pulls down a control node to an off voltage, wherein the control transistor includes one electrode and the other electrode connected to the control node, the one electrode and the other electrode being disposed on a gate electrode such that the one electrode and the other electrode being insulated from the gate electrode, wherein the gate electrode and the other electrode are disposed not to be overlapped with each other, and a distance between an upper surface of the gate electrode and a lower surface of the one electrode is longer than that of the upper surface of the gate electrode and a lower surface of the other electrode.

20 Claims, 8 Drawing Sheets

(56) References Cited

U.S. PATENT DOCUMENTS

| | | | |
|---|---|---|---|
| 2010/0156862 A1* | 6/2010 | Kim | G09G 3/3677 345/206 |
| 2010/0302230 A1* | 12/2010 | Moon | G09G 3/3677 345/212 |
| 2011/0285675 A1* | 11/2011 | Amano | G11C 19/28 345/204 |
| 2013/0087781 A1 | 4/2013 | Yeh et al. | |
| 2014/0097437 A1 | 4/2014 | Rhee et al. | |
| 2015/0380563 A1* | 12/2015 | Park | H01L 29/78606 257/43 |
| 2017/0186774 A1* | 6/2017 | Sakakura | H01L 27/124 |

OTHER PUBLICATIONS

Mativenga et al., "High current stress effects in amorphous-InGaZnO4 thin-film transistors." Applied Physics Letters, Jan. 15, 2013, 102, 023503.

\* cited by examiner

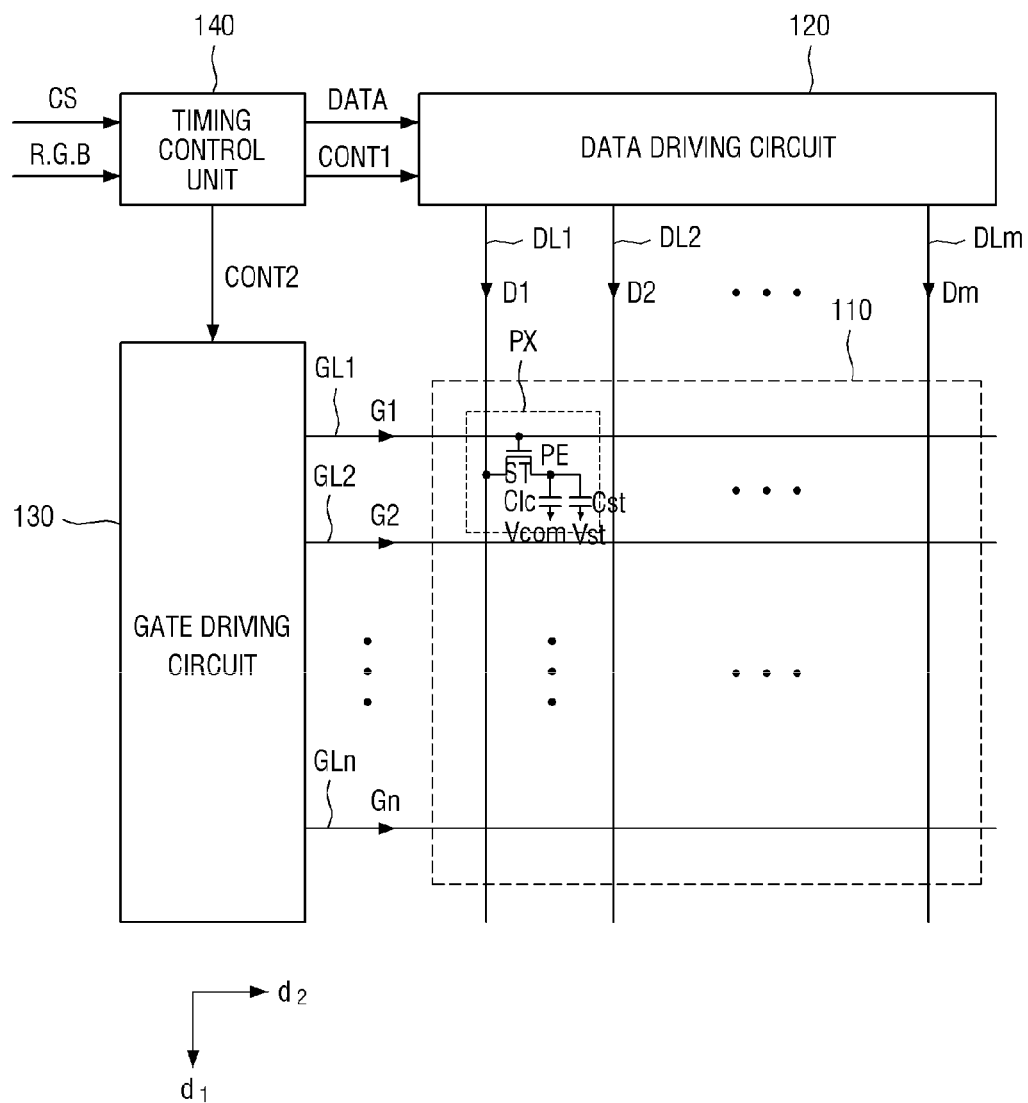
[Fig. 1]

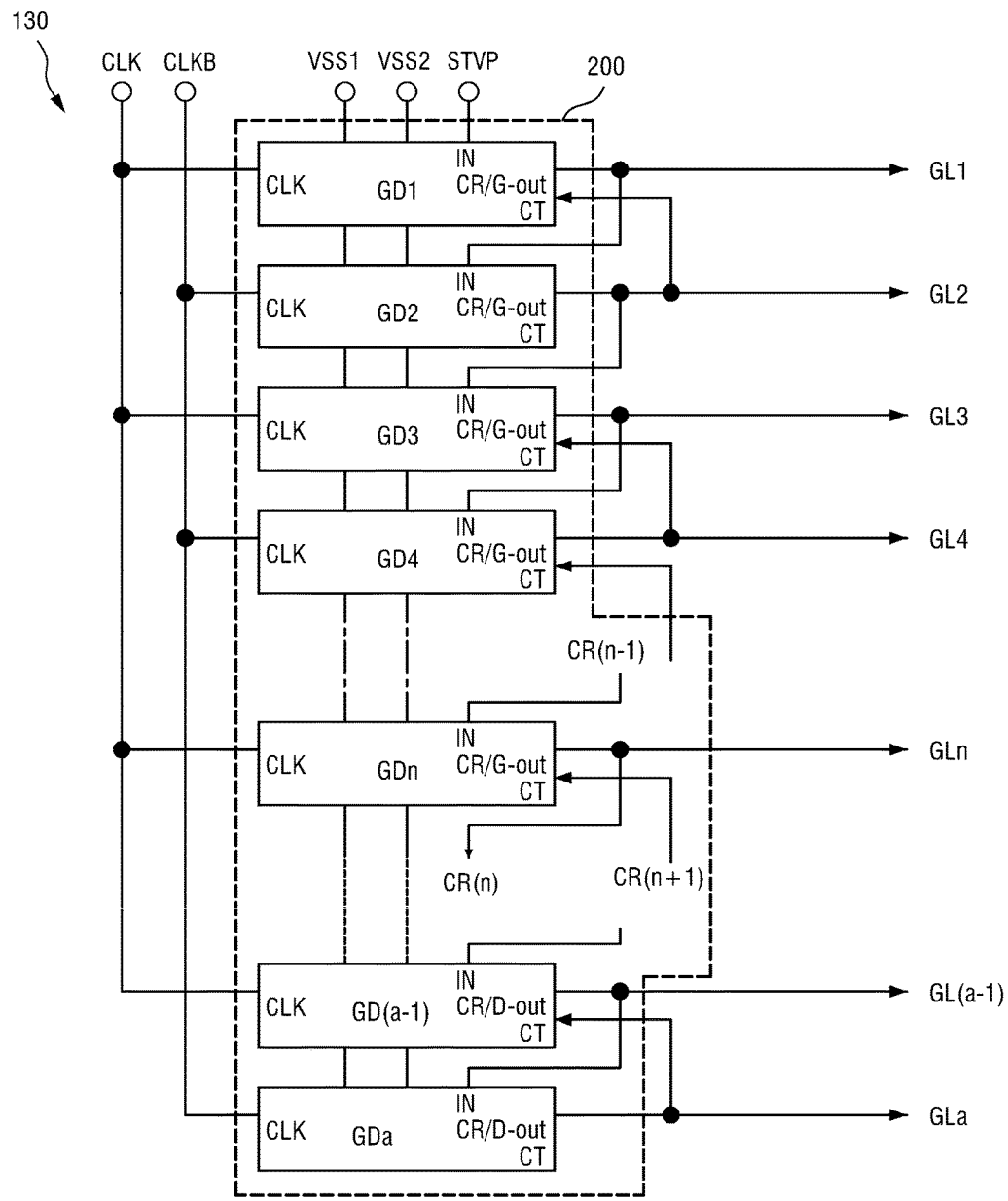

[Fig. 3]
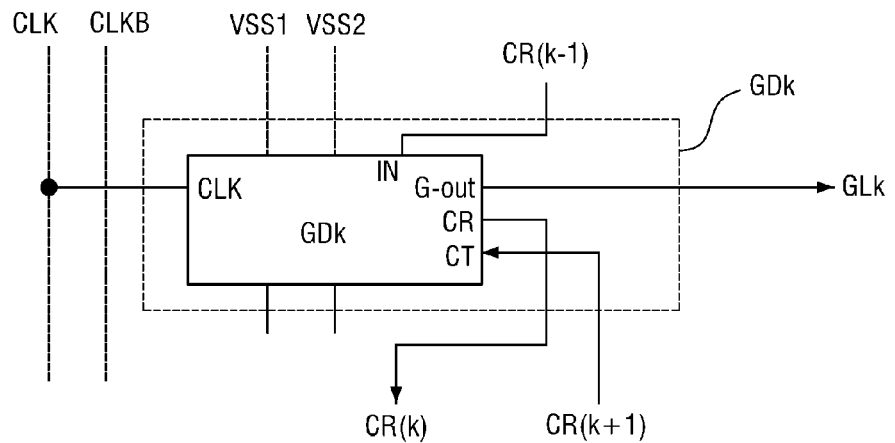
[Fig. 4]
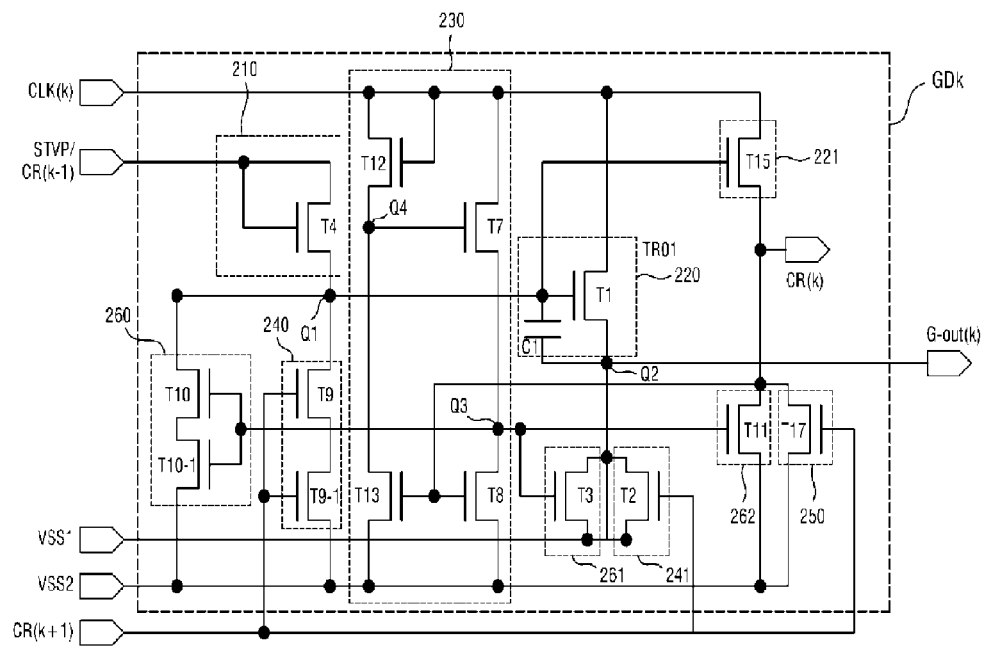

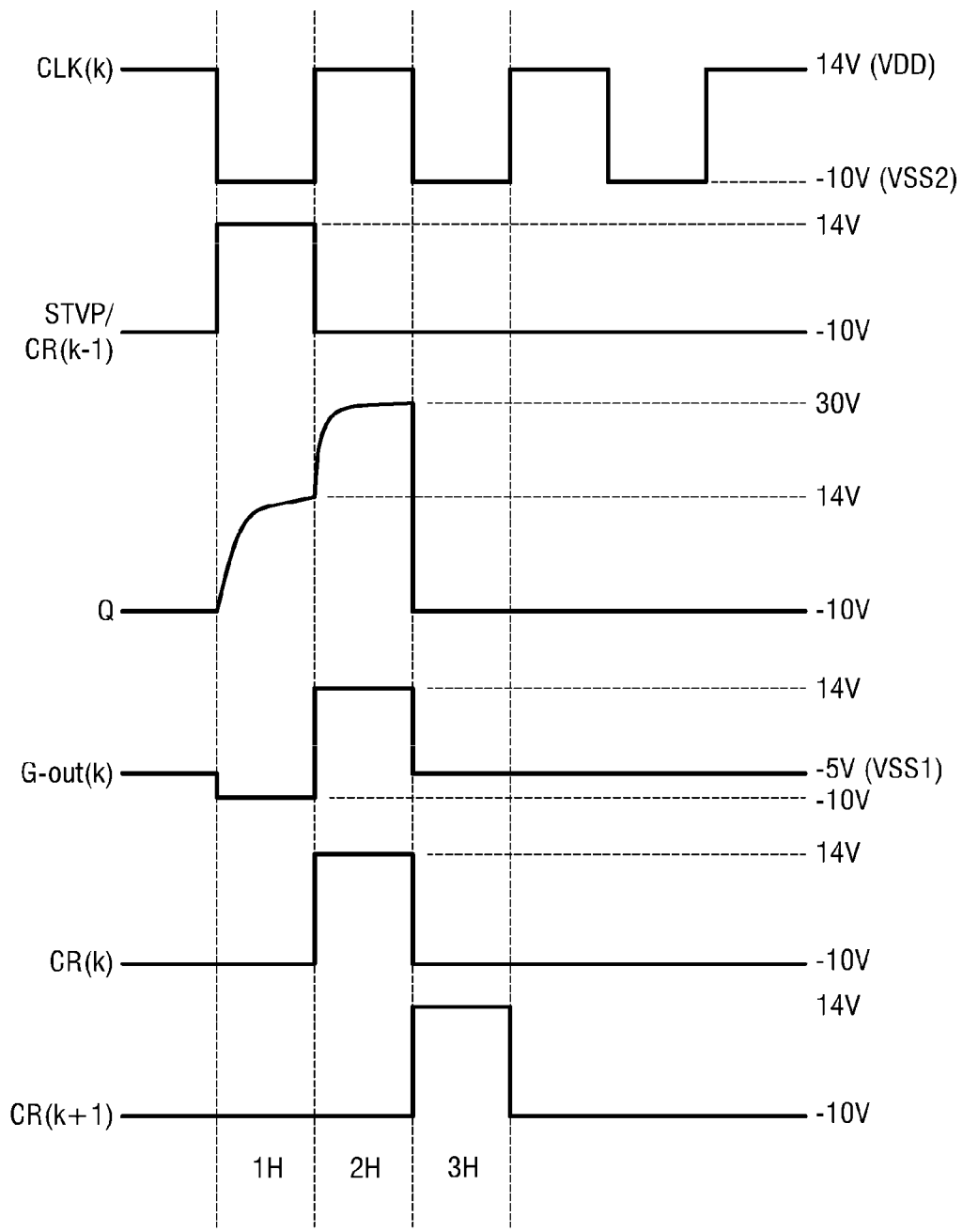
[Fig. 5]

[Fig. 6]
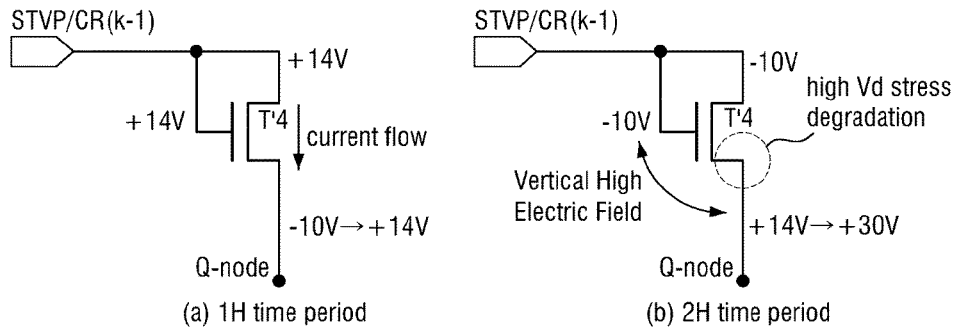
(a) 1H time period
(b) 2H time period
[Fig. 7]
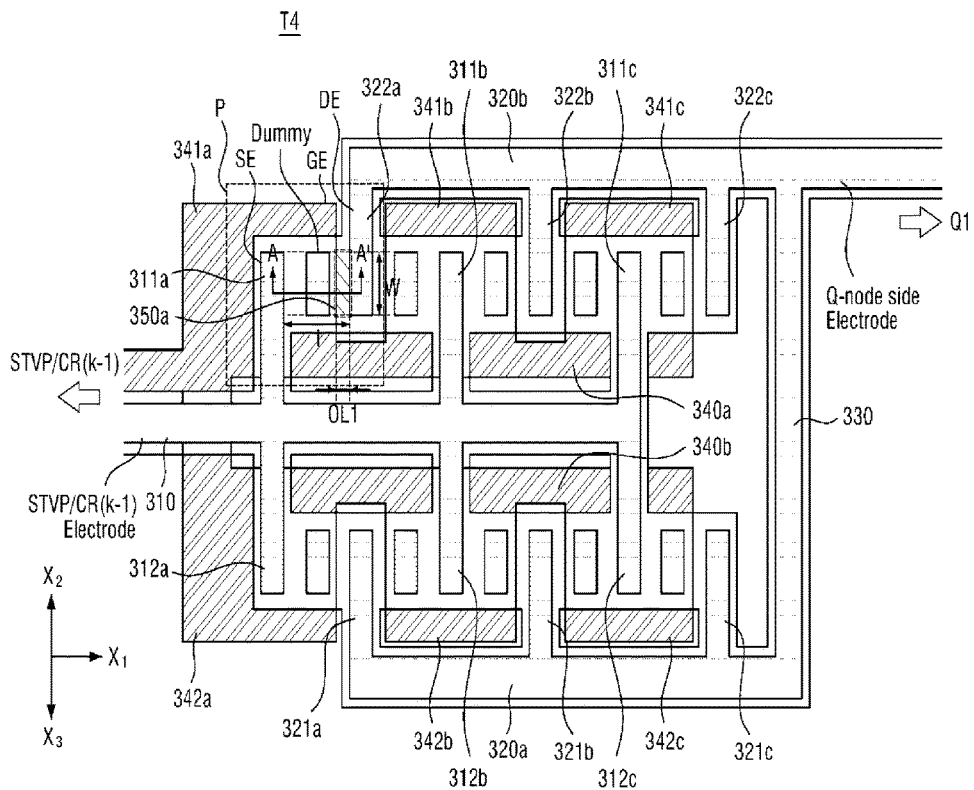

[Fig. 8]
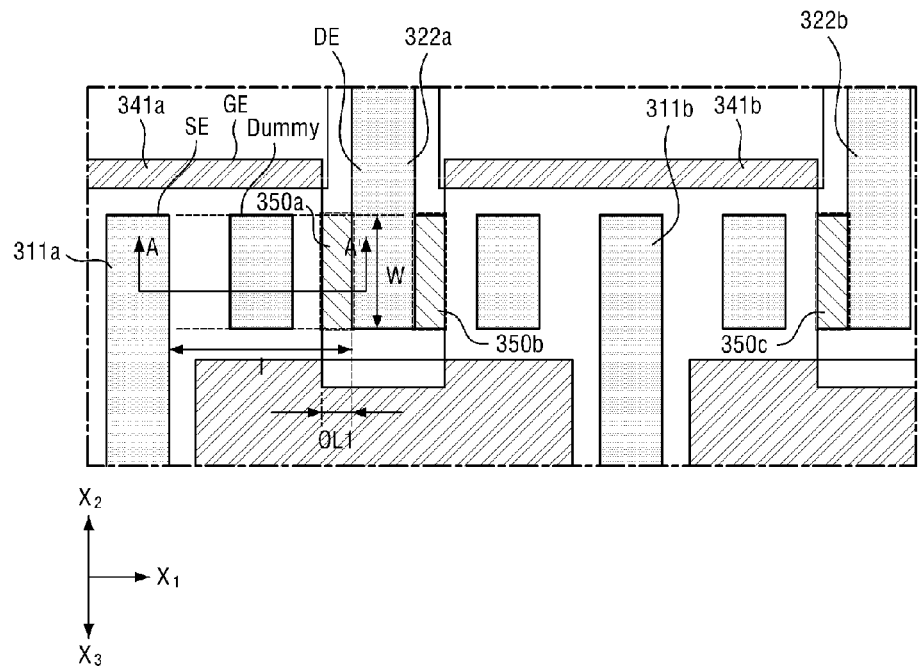
[Fig. 9]
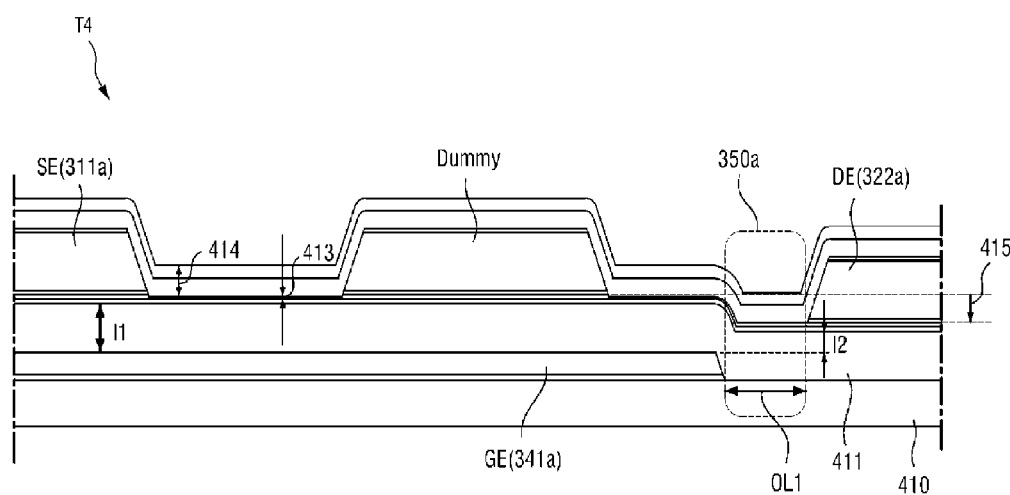

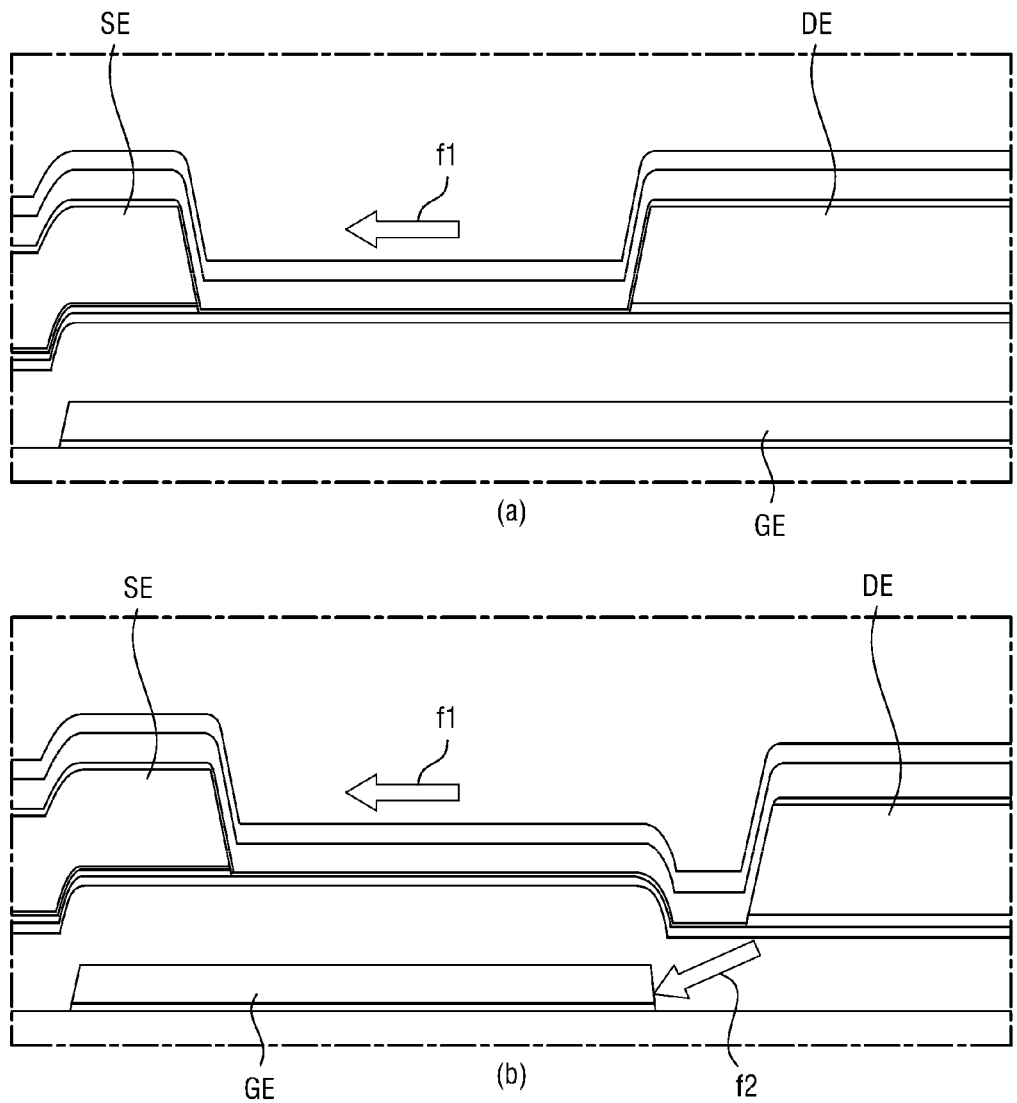
[Fig. 10]

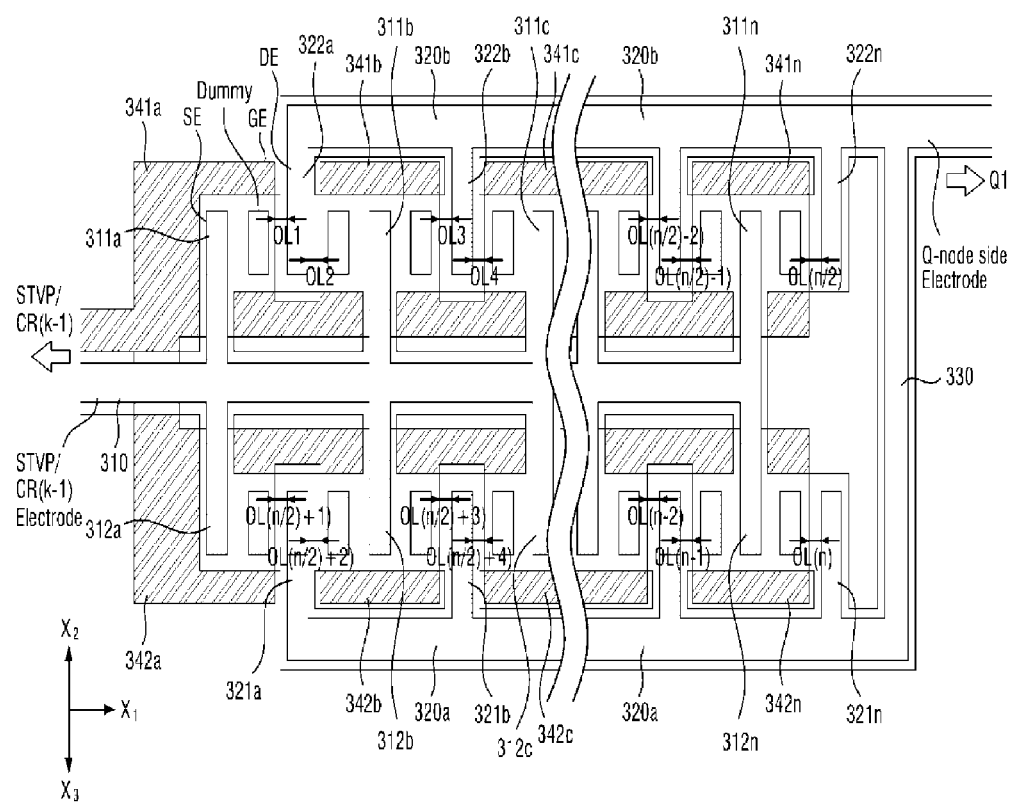
[Fig. 11]

GATE DRIVING CIRCUIT AND DISPLAY DEVICE COMPRISING THE SAME

CROSS-REFERENCE TO RELATED APPLICATIONS

This application is based on and claims priority to Korean Patent Application No. 10-2015-0077827, filed on Jun. 2, 2015 in the Korean Intellectual Property Office, the disclosure of which is incorporated herein in its entirety by reference.

BACKGROUND

1. Technical Field

The present inventive concept relates to a gate driving circuit and a display device including the same.

2. Description of the Related Art

The importance of display devices is increasing along with the development of multimedia. Accordingly, various kinds of display devices such as liquid crystal displays (LCDs), organic light emitting diodes (OLEDs) and the like are being used.

An LCD among such display devices is presently one of the most widely used flat panel display devices, and includes two sheets of substrate having electric field generating electrodes such as pixel electrodes, common electrodes and the like formed thereon, and a liquid crystal layer interposed between the substrates. The LCD applies a voltage to the electric field generating electrodes so as to generate an electric field in the liquid crystal layer, and thus determines the orientation of liquid crystal molecules of the liquid crystal layer and controls the polarization of incident light so as to thereby display an image.

An LCD includes a display panel and a driving circuit unit. The display panel includes a plurality of gate lines and a plurality of data lines. The driving circuit unit includes a gate driving part which outputs gate signals to the plurality of gate lines, and a data driving circuit which outputs a plurality of data signals to the plurality of data lines. Recently, in order to reduce the overall size of an LCD and improve productivity, a process in which the gate driving part is integrated as an integrated circuit on a display substrate has been developed.

SUMMARY

Accordingly, one subject to be solved by the present inventive concept is to provide a display device, which can prevent adhesives from flowing into an inside of an intaglio pattern portion and thus can prevent the degree of pattern scattering from being affected thereby during a pressing process.

Another subject to be solved by the present invention is to provide a display device, which can provide a superior side viewing angle while implementing superior front luminance.

Still another subject to be solved by the present invention is to provide an optical film, which can provide a superior side viewing angle while implementing superior front luminance.

Additional advantages, subjects, and features of the invention will be set forth in part in the description which follows and in part will become apparent to those having ordinary skill in the art upon examination of the following or may be learned from practice of the invention.

According to an aspect of the present inventive concept, a gate driving circuit comprising: a pull-up control unit including a control transistor which applies a carry signal provided from a carry terminal of one of previous stages to a control node; a pull-up unit which outputs a clock signal into a kth gate output signal (wherein, k is a natural number equal to or larger than 1) according to a signal applied to the control node; a carry unit which outputs the clock signal into a kth carry signal according to the signal applied to the control node; and a pull-down unit which pulls down the control node to an off voltage in response to a carry signal of one of next stages, wherein the control transistor includes a gate electrode and one electrode connected to the carry terminal and the other electrode connected to the control node, the one electrode and the other electrode being disposed on the gate electrode such that the one electrode and the other electrode being insulated from the gate electrode, wherein the gate electrode and the other electrode are disposed not to be overlapped with each other, and a distance between an upper surface of the gate electrode and a lower surface of the one electrode is longer than that of the upper surface of the gate electrode and a lower surface of the other electrode.

A distance between the gate electrode and the other electrode of the control transistor is one tenth of a channel width of the control transistor.

The distance between the gate electrode and the other electrode of the control transistor is from about 0.8 μm to about 1.5 μm.

The control transistor may be disposed to be overlapped with the gate electrode between the one electrode and the other electrode.

The gate electrode of the control transistor may include first and second extended parts extending in a first direction, a plurality of first protruded parts extending from the first extended part in a second direction intersecting the first direction, and a plurality of second protruded parts extending from the second extended part in a third direction opposite to the second direction, wherein the other electrode of the control transistor is a comb-shaped electrode having a plurality of first electrode fingers.

The plurality of first electrode fingers may be disposed not to be overlapped with the gate electrode of the control transistor.

The plurality of first electrode fingers may include a plurality of fourth protruded parts disposed between the first protruded parts, and a plurality of third protruded parts disposed between the second protruded parts.

The one electrode of the control transistor may be a comb-shaped electrode having a plurality of second electrode fingers, wherein the plurality of second electrode fingers are disposed to be overlapped with the gate electrode of the control transistor.

The off voltage may include first and second off voltages having voltage levels different from each other, wherein the pull-down unit includes a first pull-down unit which pulls down the control node to the second off voltage in response to a carry signal of one of next stages, and a second pull-down unit which pulls down the kth gate output signal to the first off voltage in response to a carry signal of one of next stages.

In other aspect of the present inventive concept, a gate driving circuit including a plurality of stages which generate a gate output signal according to a carry signal provided from a carry terminal of one of previous stages and provide the gate output signal to a plurality of gate lines; and a display panel connected to the plurality of gate lines, wherein one of the plurality of stages includes a control transistor having a gate electrode and one electrode connected to the carry terminal and the other electrode connected to a control node, wherein the other electrode of the control transistor is a comb-shaped electrode having a plurality of first electrode fingers, wherein the plurality of first electrode fingers are disposed not to be overlapped with the gate electrode.

A distance from a substrate on which the gate electrode of the control transistor may be disposed, to the one electrode is longer than a distance from the substrate to the other electrode.

Spacing between the gate electrode and the other electrode of the control transistor may be one tenth of a channel width of the control transistor.

Spacing between the gate electrode and the other electrode of the control transistor may be about 0.8 µm to about 1.5 µm.

The one electrode and the other electrode of the control transistor may be disposed on an insulating layer such that the one electrode and the other electrode of the control transistor are insulated from the gate electrode.

The gate electrode of the control transistor may include first and second extended parts extending in a first direction, a plurality of first protruded parts extending from the first extended part in a second direction intersecting the first direction, and a plurality of second protruded parts extending from the second extended part in a third direction opposite to the second direction.

The plurality of first electrode fingers may include a plurality of fourth protruded parts disposed between the plurality of first protruded parts, and a plurality of third protruded parts disposed between the plurality of second protruded parts.

The one electrode of the control transistor may include a plurality of second electrode fingers having a plurality of fifth protruded parts disposed to be overlapped with the plurality of first protruded parts and a plurality of sixth protruded parts disposed to be overlapped with the plurality of second protruded parts.

The plurality of first and second electrode fingers may be disposed alternately with each other.

In other aspect of the present inventive concept, the plurality of stages further comprises: a pull-up control unit which applies the carry signal to the control node through the control transistor; a pull-up unit which outputs a clock signal into a kth gate output signal (wherein, k is a natural number equal to or larger than 1) according to a signal applied to the control node; a carry unit which outputs the clock signal into a kth carry signal according to the signal applied to the control node; and a pull-down unit which pulls down the control node to an off voltage in response to a carry signal of one of next stages.

The off voltage may include first and second off voltages having voltage levels different from each other, wherein the pull-down unit includes a first pull-down unit which pulls down the control node to the second off voltage in response to a carry signal of one of next stages, and a second pull-down unit which pulls down the kth gate output signal to the first off voltage in response to a carry signal of one of next stages.

Embodiments of the present inventive concept may provide at least an effect described below.

The problem of stress bias caused during boot strapping can be improved, thereby preventing a transistor from being degraded.

Furthermore, a gate driving circuit with improved reliability and a display device including the gate driving circuit can be provided.

However, effects of the present inventive concept are not restricted to the exemplary embodiments set forth herein and more diverse effects are included in this description.

BRIEF DESCRIPTION OF THE DRAWINGS

The above and other objects, features and advantages of the present invention will be more apparent from the following detailed description taken in conjunction with the accompanying drawings, in which:

FIG. 1 is a block diagram illustrating a display device according to one embodiment of the present inventive concept;

FIG. 2 is a block diagram illustrating the gate driving circuit shown in FIG. 1;

FIG. 3 is a block diagram illustrating a stage of the gate driving circuit shown in FIG. 2;

FIG. 4 is a detailed circuit view of the stage shown in FIG. 3;

FIG. 5 is a driving waveform diagram illustrating operation of the stage shown in FIG. 4;

FIG. 6 is a circuit view illustrating a bias condition of a control transistor according to conventional techniques;

FIG. 7 illustrates one embodiment of the control transistor included in the stage shown in FIG. 4;

FIG. 8 illustrates in more detail the embodiment shown in FIG. 7;

FIG. 9 is a cross-sectional view taken along the line A-A' of FIG. 7;

FIG. 10 illustrates an effect of the display device having the gate driving circuit according to one embodiment of the present inventive concept; and FIG. 11 illustrates another embodiment of the control transistor included in the stage shown in FIG. 7.

DETAILED DESCRIPTION OF THE EMBODIMENTS

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to limit the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present between the element and the another element. In contrast, when an element is referred to as being "directly on", "directly connected to" or "directly coupled to" another element or layer, there are no intervening elements or layers present between the element and the another element. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the present invention will be described with reference to the accompanying drawings.

FIG. 1 is a block diagram illustrating a display device according to one embodiment of the present inventive concept.

Referring to FIG. 1, the display device according to one embodiment of the present inventive concept may include a display panel 110, a data driving circuit 120, a gate driving circuit 130 and a timing control unit 140.

The display panel 110 may display an image. The display panel 110 may include a lower display plate, an upper display plate facing the lower display plate, and a liquid crystal layer interposed between the lower and upper display plates. That is, the display panel 110 may be a liquid crystal panel. The display panel 110 may be connected to a plurality of gate lines GL1 to GLn and a plurality of data lines DL1 to DLm. In addition, the display panel 110 may include a plurality of pixel parts PX connected to one of the plurality of gate lines GL1 to GLn and one of the plurality of data lines DL1 to DLm. The plurality of gate lines GL1 to GLn, the plurality of data lines DL1 to DLm, and the plurality of pixel parts may be formed on the lower display plate of the display panel 110, and the lines may be insulated from each other.

As one embodiment, the plurality of pixel parts PX may be arranged into a matrix. As one embodiment, the plurality of data lines DL1 to DLm may extend in a column direction d1 and the plurality of gate lines GL1 to GLn may extend in a row direction d2 on the lower display plate. However, the present disclosure is not limited thereto, and the plurality of gate lines GL1 to GLn may extend in the column direction d1, and the plurality of data lines DL1 to DLm may extend in the row direction d2. Each of the plurality of pixel parts PX may receive a data voltage provided thereto from one of the plurality of data lines DL1 to DLm in response to the gate signal provided from one of the plurality of gate lines GL 1 to GLn connected to the pixel parts PX.

Each of the plurality of pixel parts PX may include a scan transistor ST, a liquid crystal capacitor Clc and a storage capacitor Cst. The scan transistor ST may be configured in that a gate electrode is connected to one gate line GL1 of the gate lines, one electrode is connected to one data line DL1 of the data lines, and the other electrode is connected to the liquid crystal capacitor Clc. In this case, one electrode of the scan transistor ST may be a drain electrode as one embodiment and the other electrode of the scan transistor ST may be a source electrode as an embodiment. The liquid crystal capacitor Clc may include a pixel electrode PE connected to the other electrode of the scan transistor ST, and a common electrode Vcom facing the pixel electrode PE. The scan transistor ST may be turned on in response to a first gate signal G1 provided from the first gate line GL1, and in this case, the scan transistor ST may provide a first data voltage D1 provided from the first data line DL1 to one electrode of the liquid crystal capacitor Clc, that is, the pixel electrode PE. In addition, the pixel part PX may further include the storage capacitor Cst. The storage capacitor Cst may have one end connected to the other electrode of the scan transistor ST and the other end to which a sustain voltage is applied through a sustain electrode Vst. In this case, the sustain voltage may have a voltage level the same as that of a common voltage. Hereinafter, both the common voltage and the common electrode will be designated by Vcom, and both the sustain voltage and the sustain electrode will be designated by Vst.

The data driving circuit 120 may include, as an embodiment, a shift register, a latch, a digital-analog converter (DAC), and the like. The data driving circuit 120 may receive a first control signal CONT1 and image data DATA provided thereto from the timing control unit 140. The data driving circuit 120 may select a reference voltage in response to the first control signal CONT1, and convert the input image data DATA of a digital waveform into a plurality of data voltages D1 to Dm according to the selected reference voltage. The data driving circuit 120 may provide the generated plurality of data voltages D1 to Dm to the display panel 110.

The gate driving circuit 130 may receive a second control signal CONT2 provided thereto from the timing control unit 140. The gate driving circuit 130 may provide the plurality of gate signals G1 to Gn to the display panel 110 according to the provided second control signal CONT2. The gate driving circuit 130 will be described in detail with reference to FIG. 2 to FIG. 4.

The timing control unit 140 may receive, as an input, image signals R, G and B and a control signal CS from an external source. The control signal CS may include, as an embodiment, a vertical synchronous signal Vsync, a horizontal synchronous signal Hsync, a main clock signal MCLK, a data enable signal DE, and the like. The timing control unit 140 may process signals provided from an external source such that the signals are suitable for an operation condition of the display panel 110, and then generate the image data DATA, the first control signal CONT1 and the second control signal CONT2. The first control signal CONT1 may include a horizontal synchronization start signal STH for instructing start of an input of the image data DATA, a load signal TP for controlling an application of the plurality of data voltages D1 to Dm to the plurality of data lines DL1 to DLm, and the like. The second control signal CONT2 may include a scan start signal STV for instructing start of an output of the plurality of gate signals G1 to Gn, a gate clock signal CPV for controlling the timing of an output of a scan-on-pulse, and the like.

Meanwhile, the display device according to one embodiment of the present inventive concept may further include a power supply unit (not shown in the drawings). The power supply unit may supply operating power to the display device according to one embodiment of the present inventive concept, and supply the common voltage Vcom to the display panel 110 through a common line (not shown in the drawings). The common line may be wiring for supplying the common voltage Vcom provided from the power supply unit to the common electrode of the display panel 110. The common line may extend in one direction on one side of the display panel 110. In this case, the common line may be formed on the lower display plate or the upper display plate, and may be insulated from the plurality of gate lines GL1 to GLn. As an embodiment, the common electrode may be formed integrally on the lower display plate or the upper display plate.

FIG. 2 is a block diagram illustrating the gate driving circuit 130 shown in FIG. 1.

Referring to FIG. 2, the gate driving circuit 130 according to one embodiment of the present inventive concept may include first to nth stages GD1 to GDn and first and second dummy stages GD(a-1) and GDa which are sequentially connected to one another. The first to nth stages GD1 to GDn and the first and second dummy stages GD(a-1) and GDa may be interconnected in cascade. Furthermore, the first to nth stages GD1 to GDn may be connected to the respective plurality of gate lines GL1 to GLn so as to output gate output signals G-out. Meanwhile, odd-numbered stages among the stages 200 may receive, as an input, a clock signal CLK, a first off voltage VSS1 and a second off voltage VSS2. On the contrary, even-numbered stages among the stages 200 may receive, as an input, a clock signal CLKB, the first off voltage VSS1 and the second off voltage VSS2. Meanwhile, the clock terminal that provides the clock signals CLK and CLKB will be designated by CLK, a first off voltage terminal that provides the first off voltage VSS1 will be designated by VSS1, and a second off voltage terminal that provides the second off voltage VSS2 will be designated by VSS2.

The clock signals CLK and CLKB may be applied to the clock terminal CLK, and may be a square wave signal in which a high level and a low level alternate with each other. The clock signal CLK may be applied to the odd-numbered stages, and the clock signal CLKB may be applied to the even-numbered stages. However, the present disclosure is not limited thereto. For example, when the clock signal CLK is applied to the even-numbered stages of the gate driving circuit 130, the clock signal CLKB may be applied to the odd-numbered stages of the gate driving circuit 130. That is, the clock signal CLK may be an inverted clock signal of the clock signal CLKB.

The first and second off voltages VSS1 and VSS2 may be direct current voltages. As an embodiment, the second off voltage VSS2 may be smaller than the first off voltage VSS1. For example, the first off voltage VSS1 may be approximately -5V, and the second off voltage VSS2 may be approximately -10V.

FIG. 3 is a block diagram illustrating a stage GDk of the gate driving circuit 130 shown in FIG. 2. Hereinafter, an example will be explained in which the kth stage GDk receives a kth clock signal CLK(k) provided thereto through the clock terminal CLK, and provides a kth gate output signal G-out(k) to a kth gate line GLk. In addition, k is assumed to be a natural number that is 1 or larger and n or smaller.

Description will be made in more detail with reference to FIG. 3. The kth stage GDk may be driven in response to a k-1th carry signal CR(k-1) of a k-1th stage GDk-1 which is a previous stage. Thus, the kth stage GDk may provide the kth gate output signal G-out(k) to the kth gate line GLk, and output a kth carry signal CR(k). The kth stage GDk may pull down the kth gate output signal G-out(k) to the first off voltage VSS1 in response to a k+1th carry signal CR(k+1) of a k+1th stage GDk+1 which is a next stage.

If k is 1, the kth stage GDk may be driven in response to a vertical start signal STVP instead of the k-1th carry signal CR(k-1), and output a first gate output signal G-OUT(1) and a first carry signal CR(1).

FIG. 4 is a detailed circuit view of the kth stage GDk shown in FIG. 3. FIG. 5 is a driving waveform diagram illustrating operation of the kth stage GDk shown in FIG. 4.

The kth stage GDk may include a pull-up control unit 210, a pull-up unit 220, a carry unit 221, an inverting unit 230, a first pull-down unit 240, a second pull-down unit 241, a carry stabilization unit 250, a first holding unit 260, a second holding unit 261 and a third holding unit 262.

The pull-up control unit 210 may apply the k-1th carry signal CR(k-1) to a control node Q1 in response to the k-1th carry signal CR(k-1) provided from the previous stage GDk-1. The pull-up control unit 210 may include a control transistor T4. The control transistor T4 may be configured in that a gate electrode and one electrode are connected to the carry terminal CR and the other electrode is connected to the control node Q1. Meanwhile, if k is 1, the gate electrode and one electrode of the control transistor T4 may receive the vertical start signal STVP provided thereto rather than the k-1th carry signal CR(k-1). As an embodiment, one electrode of the control transistor T4 may be a source electrode and the other electrode of the control transistor T4 may be a drain electrode. Hereinafter, an example will be explained in which one electrode of the control transistor T4 is a source electrode and the other electrode of the control transistor T4 is a drain electrode.

Meanwhile, the control transistor T4 may further include a dummy electrode interposed between the source electrode and the drain electrode. Thus, the control transistor T4 may be a field relaxation transistor. The control transistor T4 will be described later with reference to FIG. 6 to FIG. 10.

The pull-up unit 220 may output the kth clock signal CLK(k) into the kth gate output signal G-out(k) according to the signal applied to the control node Q1. The pull-up unit 220 may include a first transistor T1. The first transistor T1 may include a gate electrode connected to the control node Q1, one electrode which receives the kth clock signal CLK(k) provided thereto, and the other electrode which outputs the kth gate output signal G-out(k). As an embodiment, one electrode of the first transistor T1 may be a source electrode and the other electrode of the first transistor T1 may be a drain electrode.

The pull-up unit 220 may further include a charge capacitor C1 interposed between the gate electrode of the first transistor T1 and a second node Q2. The charge capacitor C1 may store the signal applied to the gate electrode of the first transistor T1 so as to turn on the first transistor T1. The charge capacitor C1 may be defined by an overlapped region between the gate electrode and the drain electrode of the first transistor T1.

The carry unit 221 may output the kth clock signal CLK(k) into the kth carry signal CR(k) in response to the signal applied to the control node Q1. The carry unit 221 may include a fifth transistor T15. The fifth transistor T15 may include a gate electrode connected to the control node Q1, one electrode for receiving, as an input, the kth clock signal CLK(k), and the other electrode for outputting the kth carry signal CR(k). As an embodiment, one electrode of the fifth transistor T15 may be a source electrode, and the other electrode of the fifth transistor T15 may be a drain electrode.

The inverting unit 230 may include a seventh transistor T7, an eighth transistor T8, a twelfth transistor T12 and a thirteenth transistor T13. The seventh transistor T7 may be configured in that a gate electrode is connected to a fourth node Q4, one electrode is connected to a gate electrode of the twelfth transistor T12, and the other electrode is connected to a third node Q3. The eighth transistor T8 may be configured in that a gate electrode is connected to a gate electrode of the thirteenth transistor T13, one electrode is connected to the third node Q3, and the other electrode is connected to the second off voltage terminal VSS2. The twelfth transistor T12 may be configured in that a gate electrode and one electrode are connected to one electrode of the seventh transistor T7, and the other electrode is connected to the gate electrode of the seventh transistor T7. Furthermore, one electrode of the thirteenth transistor T13 may be connected to a fourth node Q4, and the other electrode of the thirteenth transistor T13 may be connected to the second off voltage terminal VSS2.

The first pull-down unit 240 may include a plurality of transistors connected in series. The first pull-down unit 240 may distribute the voltage of the control node Q1 and the second off voltage VSS2. Thus, reliability of the gate driving circuit 130 may be improved and life of the gate driving circuit 130 may be lengthened.

Meanwhile, the first pull-down unit 240 may include, as an embodiment, ninth and 9-1th transistors T9 and T9-1. Thus, the first pull-down unit 240 may pull-down the second node Q2 to the second gate off voltage VSS2 in respond to the k+1th carry signal CR(k+1), thereby preventing outputting the kth gate output signal G-out(k) from being outputting to the kth gate line GKk.

The second pull-down unit 241 may pull down the kth gate output signal G-out(k) to the first off voltage VSS1 in response to the k+1th carry signal CR(k+1). The second pull-down unit 241 may include the second transistor T2.

The second transistor T2 may include a gate electrode connected to the k+1th carry terminal CR(k+1), one electrode connected to the second node Q2 and the other electrode connected to the first off voltage terminal VSS1. In this case, one electrode of the second transistor T2 may be a source electrode, and the other electrode of the second transistor T2 may be a drain electrode.

The carry stabilization unit 250 may stably remove noise components caused by leakage current transmitted through the control transistor T4 of the k+1th stage GDk+1). The carry stabilization unit 250 may include a seventeenth transistor T17. The seventeenth transistor T17 may include a gate electrode connected to the k+1th carry terminal (CR(k+1), one electrode connected to the kth carry terminal CR(k), and the other electrode connected to the second off voltage terminal VSS2. As one embodiment, one electrode of the seventeenth transistor T17 may be a source electrode, and the other electrode of the seventeenth transistor T17 may be a drain electrode.

The first to third holding units 260, 261 and 262 may hold a high level state when the kth gate output signal G-out(k) is converted from a low level to a high level, and may hold the kth gate output signal G-out(k) at a low level state during one frame regardless of the voltage level of the kth clock signal CLK(k) when the kth gate output signal G-out(k) is converted from a high level to a low level.

The first holding unit 260 may include a plurality of transistors connected in series. The first holding unit 260 may include tenth and 10-1th transistors T10 and T10-1. The tenth and 10-1th transistors T10 and T10-1 may include a gate electrode connected to the third node Q3, one electrode connected to the control node Q1, and the other electrode connected to the second off voltage terminal VSS2. One electrode of the tenth and 10-1th transistors T10 and T10-1 may be a source electrode, and the other electrode of the 10th and 10-1th transistors T10 and T10-1 may be a drain electrode.

The second holding unit 261 may include a third transistor T3. The third transistor T3 may include a gate electrode connected to the third node Q3, one electrode connected to the second node Q2, and the other electrode connected to the first off voltage terminal VSS1. The third holding unit 262 may include an eleventh transistor T11. The eleventh transistor T11 may include a gate electrode connected to the third node Q3, one electrode connected to the kth carry terminal CR(k), and the other electrode connected to the second off voltage terminal VSS2. As one embodiment, one electrode of each of the third and the eleventh transistors T3 and T11 may be a source electrode, and the other electrode of each of the third and the eleventh transistors T3 and T11 may be a drain electrode.

Meanwhile, the carry signal of the previous stage provided to the kth stage GDk is not necessarily limited to the k-1th carry signal (CR(k-1), and may be the carry signal of one among the previous stages. Similarly, the carry signal of the next stage is not necessarily limited to the k+1th carry signal CR(k+1), and may be the carry signal of one among the next stages.

Meanwhile, as one embodiment, the transistor included in the kth stage GDk may be an oxide semiconductor transistor. That is, the semiconductor layer of the transistor included in the kth stage GDk may include an oxide semiconductor.

Referring to FIG. 4 and FIG. 5, the voltage of the control node Q1 of the kth stage GDk may be increased to a first level (for example, 14V) by the pull-up control unit 210 in response to the carry signal CR(k-1) provided from the previous stage, k-1th stage GDk-1. Then, the voltage of the control node Q1 may be increased to a second level (for example, 30V) which is higher than the first level by the pull-up unit 220 in response to the clock signal CLK(k) provided from the present stage, kth stage GDk. Furthermore, the voltage of the control node Q1 may be discharged by the first pull-down unit 240 to the second off voltage VSS2 in response to the carry signal CR(k+1) provided from the next stage, k+1th stage GDk+1.

Hereinafter, operation of the gate driving circuit 130 according to one embodiment of the present inventive concept will be described with reference to FIG. 4 and FIG. 5.

First, a time period in which the gate output signal G-out(k) is converted from a gate off voltage to a gate on voltage will be explained.

The pull-up control unit 210 may receive the carry signal CR(k−1) provided thereto from the previous stage GDk−1, and apply the carry signal CR(k−1) to the control node Q1. As the voltage level of the control node Q1 gradually increases, the charge amount being charged to the first capacitor C1 also increases. Consequently, the level of the voltage being charged in the first capacitor C1 may rise to a first level (for example, 14V) during a first time period 1H. Then, as the kth clock signal CLK(k) which has been maintained at a low level is converted to a high level, the first transistor T1 may be bootstrapped and output the kth clock signal CLK(k)) of high level into the kth gate output signal G-out(k)) during a second time period 2H. Furthermore, the fifteenth transistor T15 of the carry unit 221 may be turned on so as to output the kth clock signal CLK(k) to the kth carry signal CR(k).

That is, when the kth clock signal CLK(k) is converted from a low level to a high level, the first transistor T1 may be bootstrapped to output the kth gate output signal G-out(k) to an output terminal.

Now, a time period 3H in which the gate output signal G-out(k) is converted from a gate on voltage to a gate off voltage will be explained.

The first pull-down unit 240 may be turned on in respond to the k+1th carry signal CR(k+1) of high level so as to conductively connect a path between the drain electrode of the control transistor T4 and the second off voltage terminal VSS2. In addition, the second pull-down unit 241 may be turned on in respond to the k+1th carry signal CR(k+1) of high level so as to conductively connect a path between the second node Q2 and the first off voltage terminal VSS1. Thus, electric charges charged in the first capacitor C1 may be discharged to the off voltage of the second off voltage terminal VSS2 during the third time period 3H, and the first transistor T1 may be turned off so as to stop outputting the kth clock signal CLK(k).

FIG. 6 is a circuit view illustrating a bias condition of the control transistor T4 according to conventional techniques.

Referring to FIG. 5 and FIG. 6, as the control transistor T4 according to conventional techniques is turned on during the first time period 1H and thus the k−1th carry signal CR(k−1) is applied to the control node Q1, the voltage level of the control node Q1 gradually increases to a first level (for example, 14V). Then, when the kth clock signal CLK(k) is converted from a low level to a high level during the second time period 2H, electric potential of the control node Q1 may be bootstrapped as much as the amount of change in the electric potential of the second node Q2, and the first transistor T1 may output the kth clock signal CLK(k) into the kth gate output signal G-out(k).

In this case, since the drain electrode of the control transistor T4 according to conventional techniques is directly connected to the control node Q1, a stress bias of electric potential difference of approximately 40V may be generated between the drain electrode and the gate electrode during bootstrap. Thus, the control transistor T4 according to conventional techniques may be gradually degraded, thereby causing degradation in an overall reliability and shortened life of the gate driving circuit.

FIG. 7 illustrates one embodiment of the control transistor T4 included in the stage GDk shown in FIG. 4. FIG. 8 illustrates in more detail the embodiment shown in FIG. 7.

Referring to FIG. 7 to FIG. 9, the control transistor T4 may include a gate electrode GE, a source electrode SE and a drain electrode DE. Each of the source electrode SE and the drain electrode DE of the control transistor T4 may be a comb-shaped electrode. Furthermore, the source electrode SE and the drain electrode DE of the control transistor T4 may be disposed in the same layer, and insulated from the gate electrode GE. In addition, the gate electrode GE may be formed such that the gate electrode GE may not be overlapped with the drain electrode DE in a vertical direction.

In more detail, the gate electrode GE may include a first extended part 340a and a second extended part 340b extending in a first direction X1. In addition, the gate electrode GE may further include a plurality of first protruded parts 341a to 341c extending in a second direction X2 from the first extended part 340a, and a plurality of second protruded parts 342a to 342c extending in a third direction X3 from the second extended part 340b. That is, the plurality of first protruded parts 341a to 341c may extend in the direction opposite to the direction in which the plurality of second protruded parts 342a to 342c extend. Although three first protruded parts 341a to 341c and three second protruded parts 342a to 342c are depicted in FIG. 7, the present disclosure is not limited thereto. Meanwhile, the gate electrode GE of the control transistor T4 may extend so as to be connected to the carry terminal CR(k−1) of the previous stage or the vertical start signal terminal STVP.

The drain electrode DE of the control transistor T4 may include a third extended part 320a and a fourth extended part 320b extending in the first direction X1. The third and fourth extended parts 320a and 320b of the drain electrode DE may be electrically connected with each other through a connection part 330. Furthermore, the drain electrode DE may include an electrode finger having a plurality of third protruded parts 321a to 321c extending in the second direction X2 from the third extended part 320a and a plurality of fourth protruded parts 322a to 322c extending in the third direction X3 from the fourth extended part 320b. That is, the plurality of third protruded parts 321a to 321c and fourth protruded parts 322a to 322c may be disposed to face each other. Thus, the plurality of third protruded parts 321a to 321c may be disposed among the plurality of first protruded parts 341a to 341c, and the plurality of fourth protruded parts 322a to 322c may be disposed among the plurality of second protruded parts 342a to 342c.

In more detail, the plurality of third protruded parts 321a to 321c may be disposed among the plurality of first protruded parts 341a to 341c such that the plurality of third protruded parts 321a to 321c may be not be overlapped with the plurality of first protruded parts 341a to 341c. In addition, the plurality of fourth protruded parts 322a to 322c may be disposed among the plurality of second protruded parts 342a to 342c such that the plurality of fourth protruded parts 322a to 322c may be not be overlapped with the plurality of second protruded parts 342a to 342c. That is, the drain electrode DE of the control transistor T4 may be formed such that the drain electrode DE may not be overlapped with the gate electrode GE in a plan view. Meanwhile, the drain electrode DE may extend so as to be electrically connected to the control node Q1.

The source electrode SE of the control transistor T1 may include a fifth extended part 310 extending in the first direction X1, a plurality of fifth protruded parts 311a to 311c extending in the second direction X2 from the fifth extended part 310, and a plurality of sixth protruded parts 321a to 321c extending in the third direction X3 from the fifth extended part 310. That is, the plurality of fifth protruded parts 311a to 311c and the plurality of sixth protruded parts 321a to 321c may extend in the directions opposite to each other with respect to the fifth extended part 310. In addition, the plurality of fifth protruded parts 311a to 311c and the plurality of sixth protruded parts 312a to 312c may be overlapped with the gate electrode GE. Meanwhile, the source electrode SE of the control transistor T1 may extend so as to be connected to the carry terminal CR(k−1) of the previous stage or the vertical start signal terminal STVP.

Referring to FIG. 7 and FIG. 8 (region P), the control transistor T4 may further include a first electric field relaxation region 350a interposed between the first protruded part 341a and the fourth protruded part 322a. The first electric field relaxation region 350a may have a length OL1 which can be defined as horizontal spacing between the first protruded part 341a of the gate electrode GE and the fourth protruded part 322a of the drain electrode DE. As one embodiment, the length OL1 of the first electric field relaxation region 350a may be approximately one tenth of a channel width of the control transistor T4. In more detail, the length OL1 of the first electric field relaxation region 350a may be about 0.8 µm to about 1.5 µmm.

Meanwhile, the control transistor T4 may further include a second electric field relaxation region 350b interposed between the first protruded part 341b of the gate electrode GE and the fourth protruded part 322a of the drain electrode DE, and a third electric field relaxation region 350c interposed between the first protruded part 341b of the gate electrode GE and a fourth protruded part 322b of the drain electrode DE. That is, the number of the electric field relaxation regions of the control transistor T4 is not limited to those shown in the drawings, and may vary depending on the frequency of overlaps between the source electrode SE and the gate electrode GE of the control transistor T4. Furthermore, the length and width of each electric field relaxation region may not be necessarily the same, and may differ from each other.

The first electric field relaxation region 350a will now be described with reference to FIG. 9.

The control transistor T4 may further include a plurality of dummy electrodes interposed between the source electrode SE and the drain electrode DE, in the same layer as the source electrode SE and the drain electrode DE. The plurality of dummy electrodes may be formed of the same material as the source electrode SE and the drain electrode DE, and may be formed with the same process as the source electrode SE and the drain electrode DE. Thus, the control transistor T4 may be a field relaxation transistor.

FIG. 9 is a cross-sectional view taken along the line A-A' of FIG. 7. However, the first protruded part 341a is designated as a gate electrode GE, the fourth protruded part 322a is designated as a drain electrode DE, and the fifth protruded part 311a is designated as a source electrode SE on the drawing. FIG. 10 illustrates an effect of the display device having the gate driving circuit according to one embodiment of the present inventive concept.

Referring to FIG. 7 and FIG. 9, the display device according to one embodiment of the present inventive concept may include the control transistor T4 which is disposed on a lower substrate 410 and which has the gate electrode GE, the source electrode SE and the drain electrode DE.

The gate electrode GE may be disposed on the lower substrate 410. A gate insulation layer 411 may be disposed on the gate electrode GE so as to cover the gate electrode GE. A semiconductor layer 413 may be disposed on the gate insulation layer 411, and may include an active layer and an ohmic contact layer.

Furthermore, as one embodiment, the control transistor T4 may be an oxide semiconductor transistor. That is, the semiconductor layer 413 may include an oxide semiconductor. For example, the semiconductor layer 413 may include oxide semiconductor materials such as zinc oxide, tin oxide, gallium-indium-zinc (Ga—In—Zn) oxide, indium-zinc (In—Zn) oxide, indium-tin (In—Sn) oxide and indium-tin-zinc (In—Sn—Zn) oxide. The oxide semiconductor materials may be used alone or in combination. In addition, the oxide semiconductor materials may include a material doped with metal such as aluminum (Al), nickel (Ni), copper (Cu), tantalum (Ta), molybdenum (Mo), hafnium (Hf), titanium (Ti), niobium (Nb), chrome (Cr) and tungsten (W).

The source electrode SE and the drain electrode DE may be spaced apart from each other on the semiconductor layer 413. However, the source electrode SE may be formed to have a region overlapped with the gate electrode GE in a plan view. On the contrary, the drain electrode DE may be formed not to have a region overlapped with the gate electrode GE. That is, the control transistor T4 may include the first electric field relaxation region 350a interposed between the gate electrode GE and the drain electrode DE. As one embodiment, the length OL1 of the first electric field relaxation region 350a may be approximately one tenth of the channel width W of the control transistor T4 as described above. In more detail, the channel width W of the control transistor T4 may be approximately 20 µm, and in this case, the length OL1 of the first electric field relaxation region 350a may be about 0.8 µm to about 1.5 µm.

A passivation layer 414 may be disposed on the gate insulation layer 411 and the semiconductor layer 413 so as to cover the source electrode SE and the drain electrode DE. Meanwhile, as one embodiment, the control transistor T4 may further include a dummy electrode interposed between the source electrode SE and the drain electrode DE, in the same layer as the source electrode SE and the drain electrode DE. The plurality of dummy electrodes may be formed of the same material as the source electrode SE and the drain electrode DE, and may be formed with the same process as the source electrode SE and the drain electrode DE. Thus, the control transistor T4 may be a field relaxation transistor. However, the control transistor T4 may not necessarily include a dummy electrode.

Meanwhile, the control transistor T4 may include the first electric field relaxation region 350a, thereby preventing high intensity electric field from being formed in the drain electrode DE during bootstrap. Thus, the control transistor T4 may be prevented from being degraded.

If one side of the gate electrode is defined as a surface directly contacting the lower substrate 410, a distance 11 from an upper surface of the gate electrode to a lower surface of the source electrode SE may be longer than a distance 12 from the upper surface of the gate electrode to a lower surface of the drain electrode DE. That is, the lower surface of the drain electrode DE may be disposed lower than the lower surface of the source electrode SE based on the gate electrode GE (341a). Thus, the control transistor T4 may lower a channel resistance of the first electric field relaxation region 350a, and increase an amount of current. Referring to FIG. 10, electrons may flow in a first direction f1 in a gate driving circuit (a) according to conventional technique, however, electrons may flow in the first direction f1 and in a second direction f2 in a gate driving circuit (b) according to one embodiment of the present inventive concept. That is, since the lower surface of the drain electrode DE is disposed lower than the lower surface of the source electrode SE based on the gate electrode GE, electron injection to the channel direction may be occurred in the first electric field relaxation region 350a during the first time period 1H shown in FIG. 5. Thus, an amount of current may increase, and the first electric field relaxation region 350a may be prevented from being high resistant.

Referring back to FIG. 9, the source electrode SE and the drain electrode DE of the control transistor T4 may be formed into a comb-shaped electrode, and thus a plurality of transistors may be connected in parallel. That is, the control transistor T4 may have a configuration in which a plurality of transistors are connected in parallel, and each transistor may include an electric field relaxation region.

FIG. 11 illustrates another embodiment of the control transistor T4 included in the stage GDk shown in FIG. 7.

Referring to FIG. 11, the number of the plurality of transistors connected in parallel to form the control transistor T4 is not limited to those shown in FIG. 7. In this case, each of the plurality of transistors connected in parallel may include an electric field relaxation region, and respective lengths OL1 to OL(n) of the plurality of electric field relaxation regions may vary depending on the number of transistors connected in parallel. Meanwhile, the lengths OL1 to OL(n) of the plurality of electric field relaxation regions may not be necessarily the same, and may be different from each other. Thus, variation in characteristics which might occur when a mask for forming the gate electrode GE and a mask for forming source/drain electrodes SE and DE are misaligned may be minimized.

Although exemplary embodiments of the present inventive concept have been described with reference to the attached drawings, those skilled in the art will appreciate that many other variations and adaptations can be made without modifying the technical idea or substantial features of the present inventive concept. Therefore, the embodiments described above should be understood as examples in all aspects and not be limited thereto.

What is claimed is:

1. A gate driving circuit comprising:
  a pull-up control unit including a control transistor which applies a carry signal provided from a carry terminal of one of previous stages to a control node;
  a pull-up unit which outputs a clock signal into a kth gate output signal (wherein, k is a natural number equal to or larger than 1) according to a signal applied to the control node;
  a carry unit which outputs the clock signal into a kth carry signal according to the signal applied to the control node; and
  a pull-down unit which pulls down the control node to an off voltage in response to a carry signal of one of next stages,
  wherein the control transistor includes a gate electrode and one electrode connected to the carry terminal and the other electrode connected to the control node, the one electrode and the other electrode being disposed on the gate electrode such that the one electrode and the other electrode being insulated from the gate electrode,
  wherein the gate electrode and the other electrode are disposed not to be overlapped with each other, and a distance between an upper surface of the gate electrode and a lower surface of the one electrode is longer than that of the upper surface of the gate electrode and a lower surface of the other electrode.

2. The gate driving circuit of claim 1, wherein a distance between the gate electrode and the other electrode of the control transistor is one tenth of a channel width of the control transistor.

3. The gate driving circuit of claim 1, wherein the distance between the gate electrode and the other electrode of the control transistor is from about 0.8 μm to about 1.5 μm.

4. The gate driving circuit of claim 1, wherein the control transistor is disposed to be overlapped with the gate electrode between the one electrode and the other electrode.

5. The gate driving circuit of claim 1, wherein the gate electrode of the control transistor includes first and second extended parts extending in a first direction, a plurality of first protruded parts extending from the first extended part in a second direction intersecting the first direction, and a plurality of second protruded parts extending from the second extended part in a third direction opposite to the second direction,
  wherein the other electrode of the control transistor is a comb-shaped electrode having a plurality of first electrode fingers.

6. The gate driving circuit of claim 5, wherein the plurality of first electrode fingers are disposed not to be overlapped with the gate electrode of the control transistor.

7. The gate driving circuit of claim 5, wherein the plurality of first electrode fingers include a plurality of fourth protruded parts disposed between the first protruded parts, and a plurality of third protruded parts disposed between the second protruded parts.

8. The gate driving circuit of claim 7, wherein the one electrode of the control transistor is a comb-shaped electrode having a plurality of second electrode fingers, wherein the plurality of second electrode fingers are disposed to be overlapped with the gate electrode of the control transistor.

9. The gate driving circuit of claim 1, wherein the off voltage includes first and second off voltages having voltage levels different from each other,
  wherein the pull-down unit includes a first pull-down unit which pulls down the control node to the second off voltage in response to a carry signal of one of next stages, and a second pull-down unit which pulls down the kth gate output signal to the first off voltage in response to a carry signal of one of next stages.

10. A display device comprising:
  a gate driving circuit including a plurality of stages which generate a gate output signal according to a carry signal provided from a carry terminal of one of previous stages and provide the gate output signal to a plurality of gate lines; and
  a display panel connected to the plurality of gate lines,
  wherein one of the plurality of stages includes a control transistor having a gate electrode and one electrode connected to the carry terminal and the other electrode connected to a control node,
  wherein the other electrode of the control transistor is a comb-shaped electrode having a plurality of first electrode fingers,
  wherein the plurality of first electrode fingers are disposed not to be overlapped with the gate electrode.

11. The display device of claim 10, wherein a distance from a substrate on which the gate electrode of the control transistor is disposed, to the one electrode is longer than a distance from the substrate to the other electrode.

12. The display device of claim 11, wherein the one electrode and the other electrode of the control transistor are disposed on an insulating layer such that the one electrode and the other electrode of the control transistor are insulated from the gate electrode.

13. The display device of claim 11, wherein the gate electrode of the control transistor includes first and second extended parts extending in a first direction, a plurality of first protruded parts extending from the first extended part in a second direction intersecting the first direction, and a plurality of second protruded parts extending from the second extended part in a third direction opposite to the second direction.

14. The display device of claim 13, wherein the plurality of first electrode fingers include a plurality of fourth protruded parts disposed between the plurality of first protruded parts, and a plurality of third protruded parts disposed between the plurality of second protruded parts.

15. The display device of claim 14, wherein the one electrode of the control transistor includes a plurality of second electrode fingers having a plurality of fifth protruded parts disposed to be overlapped with the plurality of first protruded parts and a plurality of sixth protruded parts disposed to be overlapped with the plurality of second protruded parts.

16. The display device of claim 15, wherein the plurality of first and second electrode fingers are disposed alternately with each other.

17. The display device of claim 10, wherein spacing between the gate electrode and the other electrode of the control transistor is one tenth of a channel width of the control transistor.

18. The display device of claim 10, wherein spacing between the gate electrode and the other electrode of the control transistor is about 0.8 μm to about 1.5 μm.

19. The display device of claim 11, wherein the plurality of stages further comprises:
 a pull-up control unit which applies the carry signal to the control node through the control transistor;
 a pull-up unit which outputs a clock signal into a kth gate output signal (wherein, k is a natural number equal to or larger than 1) according to a signal applied to the control node;
 a carry unit which outputs the clock signal into a kth carry signal according to the signal applied to the control node; and
 a pull-down unit which pulls down the control node to an off voltage in response to a carry signal of one of next stages.

20. The display device of claim 19, wherein the off voltage includes first and second off voltages having voltage levels different from each other,
 wherein the pull-down unit includes a first pull-down unit which pulls down the control node to the second off voltage in response to a carry signal of one of next stages, and a second pull-down unit which pulls down the kth gate output signal to the first off voltage in response to a carry signal of one of next stages.

* * * * *